United States Patent [19]

Doushita et al.

[11] Patent Number: 5,322,733

[45] Date of Patent: Jun. 21, 1994

[54] MAGNETIC RECORDING MEDIUM

[75] Inventors: Hiroaki Doushita; Tadashi Yasunaga, both of Kanagawa, Japan

[73] Assignee: Fuji Photo Film Co., Ltd., Kanagawa, Japan

[21] Appl. No.: 755,937

[22] Filed: Sep. 6, 1991

[30] Foreign Application Priority Data

Sep. 7, 1990 [JP] Japan .................................. 2-238325

[51] Int. Cl.⁵ .......................... B32B 5/16; B32B 15/00; G11B 5/66
[52] U.S. Cl. ..................... 428/336; 428/678; 428/694 T; 428/694 TP; 428/702; 428/695; 428/900
[58] Field of Search ............... 428/336, 678, 694, 702, 428/695, 900, 694 T, 694 TP; 427/130, 131

[56] References Cited

U.S. PATENT DOCUMENTS

| 4,323,629 | 4/1982 | Kunieda | 428/457 |
| 4,567,116 | 1/1986 | Sawada et al. | 428/694 |
| 4,596,735 | 6/1986 | Noguchi et al. | 428/215 |
| 4,711,810 | 12/1987 | Ando | 428/336 |
| 5,073,449 | 12/1991 | Niimi et al. | 428/336 |

FOREIGN PATENT DOCUMENTS 56-15014 of 1981 Japan .
57-79951 of 1982 Japan .
60-160027 of 1985 Japan .
62-275316 of 1987 Japan .

OTHER PUBLICATIONS

"Japanese Applied Magnetics Academy Transactions" vol. 14, No. 2, 1990, pp. 251–256.

Primary Examiner—Paul J. Thibodeau
Assistant Examiner—Leszek Kiliman
Attorney, Agent, or Firm—Sughrue, Mion, Zinn, Macpeak & Seas

[57] ABSTRACT

A metal thin-film magnetic recording medium has a non-magnetic base and a ferromagnetic metal thin-film formed on the non-magnetic base and containing therein Co as a major component. The ratio of the area of 130 plane of CoOOH of the metal thin-film to that of 111 plane of CoO of the same obtained by thin-film X-ray diffraction method is not smaller than 0.003 and is smaller than 0.1.

7 Claims, 2 Drawing Sheets

MAGNETIC RECORDING MEDIUM

BACKGROUND OF THE INVENTION

1. Field of the Invention

This invention relates to a magnetic recording medium, and more particularly to a high-output ferromagnetic metal thin-film recording medium which has an improved resistance to corrosion.

2. Description of the Prior Art

There has been in wide use so-called coated magnetic recording media comprising a non-magnetic base and a magnetic layer which is formed by coating magnetic powder together with binder on the non-magnetic base and drying the same.

However, recently, there has been an increasing demand for high-density recording, and the demand cannot be satisfied by the conventional coated magnetic recording media.

Accordingly, there has been recently developed and put into practical use a so-called metal thin-film magnetic recording medium having a ferromagnetic metal thin-film formed on a non-magnetic base by a vacuum film-forming method such as vacuum deposition, sputtering or the like.

The metal thin-film magnetic recording medium has excellent properties as a magnetic recording medium for the high-density recording. For example, it is excellent in electromagnetic conversion properties in short wavelength recording due to its large coercive force and squareness ratio, and in the metal thin-film magnetic recording medium, the thickness loss is very small due to its very thin magnetic layer.

Among the metal thin-film magnetic recording medium, those having a magnetic layer of Co alloys exhibit excellent magnetic recording properties. Especially those obtained by oblique deposition of $Co_{80}Ni_{20}$ alloy has been known as "deposition tape" and has been in wide use.

Further, a metal thin-film magnetic recording medium having a Co—CoO magnetic thin-film provided with vertical magnetic anisotropy is considered to be promising for high-density recording.

However, since Co does not have sufficient resistance to corrosion, the metal thin-film magnetic recording medium having a magnetic layer of Co alloys can easily rust when the thin-film sweats or is placed in an atmosphere containing therein corrosive gas, whereby the magnetic properties deteriorate or the magnetic head can clog during running. Various efforts to overcome the problem by adding Ni, Cr or oxides to the metal thin-film have been made. However, at present, such efforts have not succeeded. Further, addition of additives involves deterioration of the magnetic properties and accordingly it has been difficult to improve the resistance to corrosion by addition of additives without adversely affecting the electromagnetic conversion properties. For example, in the early deposition tape, the thin-film can rust by merely letting it stand in the air or the magnetic flux can reduce by half in one year or so. Accordingly, the early deposition tape is disadvantageous from the viewpoint of storage of information.

Further it has been proposed to limit the proportion of oxygen atoms to the whole atoms in the magnetic layer and cover the magnetic layer or prismatic grains forming the magnetic layer with an oxide layer, thereby improving the resistance to corrosion of the thin-film. (See, for instance, Japanese Unexamined Patent Publication Nos. 56(1981)-15014 and 57(1982)-179951, and the like.

Further, as disclosed in Japanese Unexamined Patent Publication No. 62(1987)-275316, the resistance to corrosion of the metal thin-film magnetic recording medium can be improved by forming a passive film of amorphous cobalt compound on the surface of the ferromagnetic metal thin-film. Further a method of forming a passive film of $Co_3O_4$ on the ferromagnetic metal thin-film is disclosed in Japanese Unexamined Patent Publication No. 60(1985)-160027.

However, in accordance with the prior arts described above, the resistance to corrosion of the metal thin-film magnetic recording medium cannot be satisfactorily improved without increasing the thickness of the non-magnetic layer. However increase in the thickness of the non-magnetic layer increases the spacing loss and deteriorates the electromagnetic conversion properties.

In "Japanese Applied Magnetics Academy Transactions" Vol. 14, No. 2, 1990, it is reported that corrosion of the thin-film progresses by reaction of CoO and Co(OH)$_2$ with oxygen to form $Co(OH)_2$ and CoOOH. However, no attempt to control the amount of $Co(OH)_2$ and CoOOH has been made.

SUMMARY OF THE INVENTION

In view of the foregoing observations and description, the primary object of the present invention is to provide a high-output ferromagnetic metal thin-film recording medium having a magnetic layer of Co alloy which is excellent in resistance to corrosion.

The inventors investigated compositions of surface oxides of Co alloy thin-film recording media, especially $Co(OH)_2$ and CoOOH, and found a corelation between the content of CoOOH in the ferromagnetic metal thin-film and the resistance to corrosion of the film, thereby making this invention.

The metal thin-film magnetic recording medium in accordance with the present invention comprises a non-magnetic base and a ferromagnetic metal thin-film formed on the non-magnetic base and containing therein Co as a major component, characterized in that the ratio of the area of 130 plane of CoOOH to that of 111 plane of CoO obtained by thin-film X-ray diffraction method is not smaller than 0.003 and is smaller than 0.1.

In this specification, the "thin-film X-ray diffraction method" means a normal thin-film X-ray diffraction method wherein the incident angle of X-rays is not larger than 1°.

The ferromagnetic metal thin-film containing therein Co as a major component may be formed either of Co by itself or of alloy containing Co. For example, the thin-film may be formed of Co—Ni, Co—Pt, Co—Ni—Pt, Co—Fe, Co—Ni—Fe or the like. Further, the thin-film may contain Al, B, Cr or the like. The amount of the elements which form such alloy should be limited not to break the crystal structure of Co (FCC).

Thus the 130 plane of CoOOH may contain therein components other than CoOOH and the 111 plane of CoO may contain therein components other than CoO. For example, when the metal thin-film comprises 80 at % Co and 20 at % Ni, the 111 plane of CoO means the 111 plane of CoNiO (Co:Ni=80:20).

When the oxygen content in the ferromagnetic metal thin-film is not less than 15 at %, especially excellent resistance to corrosion and magnetic recording properties can be obtained.

The ferromagnetic metal thin-film of the magnetic recording medium in accordance with the present invention is preferably formed by oblique deposition method. The magnetic recording medium for the horizontal magnetization system is generally produced by the oblique deposition method. When the angle of incidence of metal vapor is excessively large, the deposition efficiency lowers, which adversely affects the manufacturing cost, and when the angle of incidence is too small, magnetic properties such as coercive force, squareness ratio and the like deteriorate. Accordingly, the minimum angle of incidence $\theta$min is preferably 20° to 60° and more preferably 25° to 50°.

Further, the ferromagnetic metal thin-film of the magnetic recording medium in accordance with the present invention may be a vertically magnetized thin-film of Co—CoO which is formed by causing vapor of Co alloy to impinge upon a non-magnetic base at about 90° in an oxygen atmosphere.

The thickness of the ferromagnetic metal thin-film is preferably 500 to 5000 Å, and more preferably 1000 to 3000 Å.

The surface of the ferromagnetic metal thin-film may be applied with various lubricants such as of fatty acids, fatty esters, fatty amides, fatty alcohols, metal soaps, paraffins, silicones and the like in order to improve runnability and/or durability of the magnetic recording medium. More particularly, the lubricant can comprise saturated or unsaturated fatty acids having more than eleven carbon atoms per mole such as lauric acid, myristic acid, palmitic acid, stearic acid or the like; fatty esters such as ethyl stearate, monoglyceride stearate, amyl stearate or the like; fatty amides such as caprinamide, lauryl amide, stearylamide or the like; metal soaps which are salt of one of said fatty acids and Zn, Pb, Ni, Co, Al, Mg, Cu or the like; fatty alcohols such as cetyl alcohol, stearyl alcohol or the like; polycyclohexanes in which alkyl groups or phenyl groups are partly substituted for hydrogen atoms; or silicones obtained by modifying such polycyclohexanes with fats, fatty alcohols or fatty amides.

Further, various kinds of fluorine-containing compounds perform as a good lubricant. The specific examples of the good lubricant include perfluoropolyethers, perfluoropolyethers whose ends are modified with polar groups, fatty groups or aromatic groups; fatty esters having fluoroalkyl or fluoroalkenyl groups; fluorine-substituted fatty acids, and the salts or the amides thereof; oligomeric surfactants having fluorine-substituted fatty acid groups and hydrophilic groups in their branches; oligomeric surfactants having fluorine-substituted fatty acid groups and lipophilic groups in their branches; and the like.

As the non-magnetic base, polyesters such as polyethylene terephthalate; polyolefins such as polyethylene and polypropylene; cellulose derivatives; vinyl resins; polycarbonate; polyimide and the like in the form of a film, sheet, disk or the like may be used.

A back coat layer containing therein non-magnetic fine powder of carbon black or the like and binder resin may be provided on the side of the non-magnetic base opposite to the side on which the magnetic thin-film is formed.

In the conventional metal thin-film magnetic recording medium having a ferromagnetic metal thin-film containing therein Co as a major component, the ratio of the area of 130 plane of CoOOH to that of 111 plane of CoO obtained by thin-film X-ray diffraction method is not smaller than 0.1, and the conventional metal thin-film magnetic recording medium cannot be excellent both in the output power and in the resistance to corrosion.

DESCRIPTION OF THE PREFERRED EMBODIMENT

Figure 1:
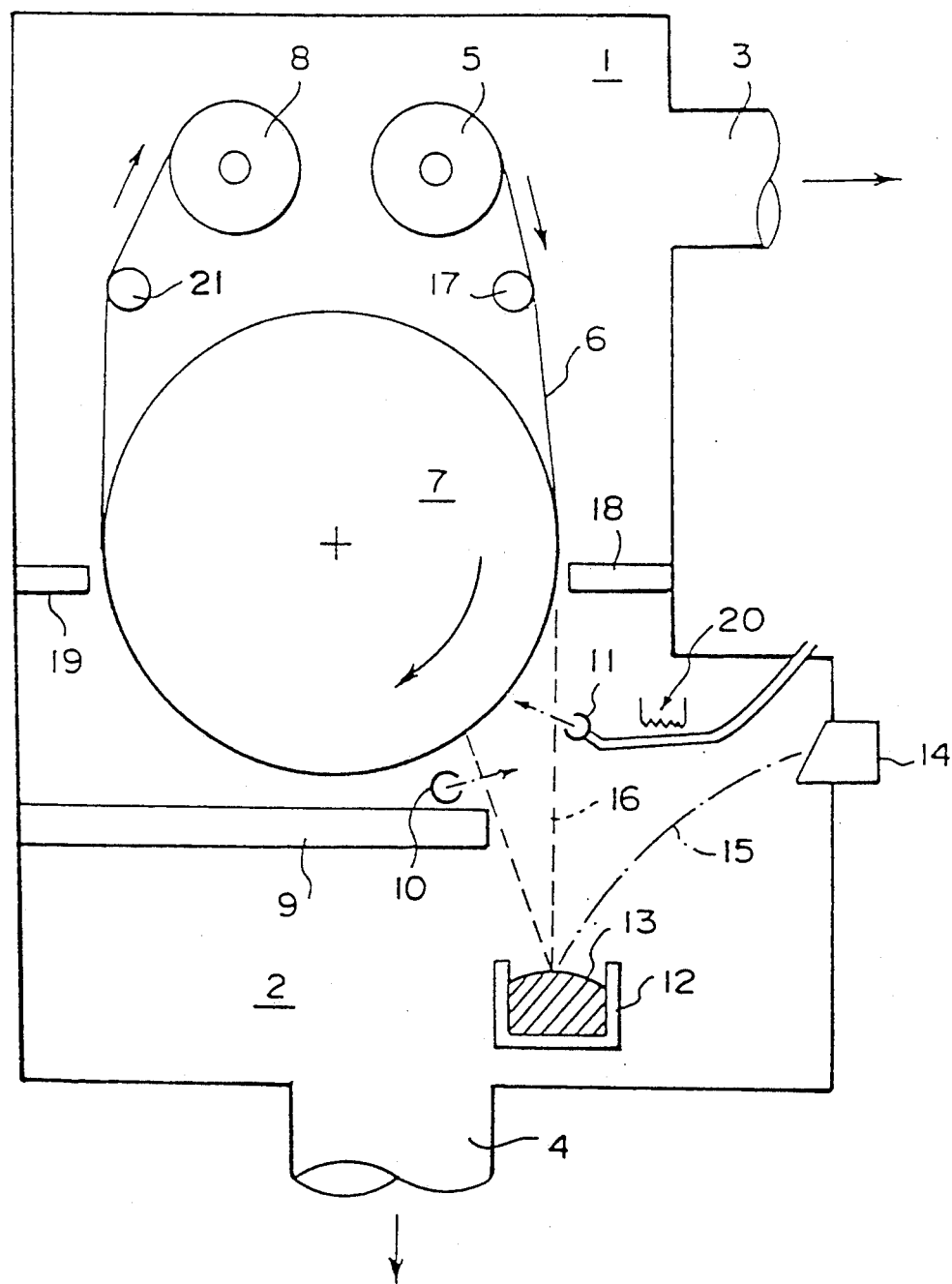
FIG. 1 is a schematic cross-sectional view showing a depositing apparatus for manufacturing a magnetic recording medium in accordance with an embodiment of the present invention.

In FIG. 1, a depositing apparatus has a non-magnetic base feed-and-take-up chamber 1 and a film-forming chamber 2 which are separated from each other by a pair of partition walls 18 and 19 and a cooling can 7 disposed between the partition walls 18 and 19. A non-magnetic base 6 wound around a feed roller 5 disposed in the non-magnetic base feed-and-take-up chamber 1 is unrolled from the feed roller 5 and taken up by a take-up roller 8 while passing by a roller 17, the side surface of the cooling can 7 facing to the film-forming chamber 2 and a roller 21.

The chambers 1 and 2 are evacuated to a predetermined degree of vacuum through evacuation ports 3 and 4.

A crucible 12 is disposed in the film-forming chamber 2 and ferromagnetic metal 13 containing therein Co is placed in the crucible 12. The ferromagnetic metal 13 is heated to melt and evaporate by an electron beam 15 emitted from an electron gun 14, and a vapor flow 16 of the metal 13 is caused to impinge upon the non-magnetic base 6 on the cooling can 7. An intercept plate 9 intercepts a part of the vapor flow 16 which impinges upon the non-magnetic base 6 at an angle of incidence smaller than a predetermined value. The angle of incidence is the angle which the vapor flow 16 makes with the normal to the cooling can 7.

Oxidizing gas is introduced into the film-forming chamber 2 toward the non-magnetic base 6 together with the vapor flow 16 from gas introduction ports 10 and 11 which are provided respectively on the low incident angle side and the high incident angle side.

As the oxidizing gas, oxygen, nitrous oxide, ozone or mixture of these gas with inert gas such as argon, nitrogen or the like may be used. It is preferred that mixture of oxygen and argon or nitrogen be used as the oxidizing gas.

Though the amount of the oxidizing gas depends upon the conveying speed and the width of the non-magnetic base 6, an excessively large amount and an excessively small amount of oxidizing gas both can result in deterioration of magnetic properties.

It is preferred that the oxidizing gas be introduced from the port 11 in a direction which makes with the normal to the cooling can 7 an angle which is larger than the average $(\theta max + \theta min)/2$ of the maximum angle $\theta$max of incidence of the vapor flow 17 and the minimum angle $\theta$min of the same.

The ferromagnetic metal thin-film thus obtained may be subjected to surface treatment for the purpose of oxidization and/or passivation. An especially preferable treatment is an ozone treatment in which the ferromagnetic metal thin-film is exposed to an ozone-containing atmosphere.

In such an ozone treatment, the temperature at which the ferromagnetic metal thin-film is kept, the ozone concentration in the atmosphere, the treating time and the like should be controlled.

As for the temperature at which the ferromagnetic metal thin-film should be kept, though there is no specific critical point, if the ferromagnetic metal thin-film is kept at a room temperature, the treatment must be effected at a high ozone concentration for a long time, which is not preferable in view of efficiency. Just from the viewpoint of improvement of the resistance to corrosion, the higher the temperature is, the better the result is, but when the temperature is not lower than 140° C., the non-magnetic base can be adversely affected. Further when the temperature is not lower than 140° C., the inverse cupping of the magnetic tape can become too large and the magnetic head cannot contact with the magnetic tape in a satisfactory manner.

Taking into account these points, the ferromagnetic metal thin-film is preferably kept at 80° to 140° C. during the ozone treatment.

As for the ozone concentration in the atmosphere and the treating time, when the former and the latter are respectively represented by x (ppm) and y (seconds), the resistance to attack by salts of the ferromagnetic thin-film can be remarkably improved by setting the former and the latter so that the product of them becomes not smaller than 150000, i.e., $xy \geq 150000$.

The surface of the ferromagnetic metal thin-film should be cleaned prior to the ozone treatment. If the surface of the ferromagnetic metal thin-film is stained, a part of the ozone is consumed in removing the staining material and the effect inherent to the ozone treatment cannot be sufficiently obtained. The cleanness of the surface of the ferromagnetic metal thin-film can be controlled, for instance, by water contact angle, and it is preferred that the surface of the ferromagnetic metal thin-film be cleaned to such a degree that the water contact angle is not larger than 60° prior to the ozone treatment.

As the ozone-containing atmosphere, an atmosphere of dry air added with ozone, or an atmosphere of inert gas, e.g., nitrogen, argon, herium or the like, added with ozone may be used for instance.

The ozone treatment can be effected by keeping the ferromagnetic metal thin-film for a predetermined time in a treating chamber filled with the ozone-containing atmosphere, and may be either a batch process or a continuous process.

Figure 2:
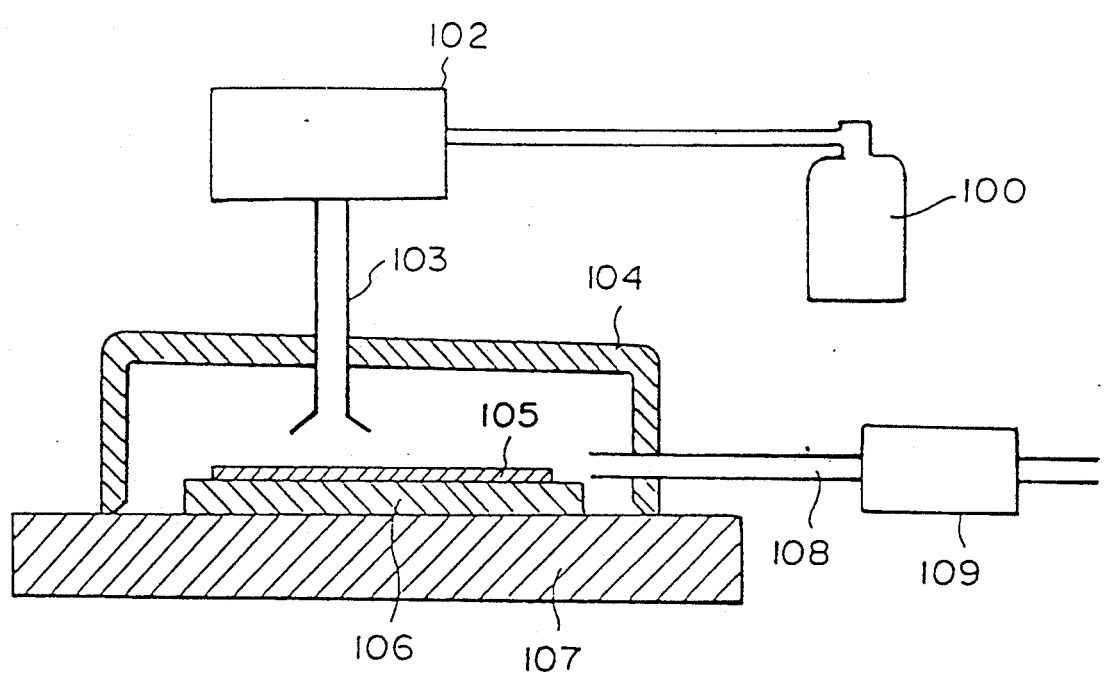
FIG. 2 is schematic cross-sectional view showing an ozone treatment apparatus.

FIG. 2 shows an example of a batch process ozone treating system. The treating system comprises a base plate 107 and a casing 104 placed on the base plate 107. A hot plate 106 is disposed in the treating chamber defined by the casing 104 and the base plate 107. A sample 105 (a metal thin-film magnetic recording medium comprising a non-magnetic base and a ferromagnetic metal thin-film formed thereon) is fixed to the hot plate 106 so that the ferromagnetic metal thin-film faces upward and is kept at a predetermined temperature by the hot plate 106. Oxygen is introduced from an oxygen reservoir into an ozonizer 102, and oxygen gas partly ozonized is introduced into the treating chamber through an introduction pipe 103, whereby the sample 105 is subjected to ozone treatment. The oxygen gas partly ozonized is discharged through a discharge pipe 108 to a catalytic decomposer 109 and the ozone contained therein is decomposed.

EXAMPLE 1

In the depositing apparatus shown in FIG. 1, the film-forming chamber 2 was initially evacuated to $1 \times 10^{-5}$ Torr, and a non-magnetic base of polyethylene terephthalate in continuous length was fed from the feed roller 5 toward the take-up roll 8 at a speed of 15 m/min. The non-magnetic base was 10 μm in thickness and 100 mm in width. Co—Ni alloy (Co:Ni=80:20 atomic ratio) was placed in the crucible 12 as the ferromagnetic metal 13 and heated by an electron beam 15 to form a vapor flow 16. Oxygen gas was introduced through the gas introduction ports 10 and 11 at 600 ml/min and 1200 ml/min, respectively. In this manner, a Co—Ni alloy ferromagnetic metal thin-film was formed on the non-magnetic base 6. The thickness of the thin-film was 0.17 μm. The minimum angle of incidence was set at 35°.

The magnetic recording medium thus obtained was cut into a sample 80 mm square and the sample was subjected to the ozone treatment using the batch process ozone treating system shown in FIG. 2, thereby obtaining a final sample. The ozone concentration in the treating chamber was 28000 ppm, the sample was kept at 120° C. by the hot plate 106 and the treating time was 30 seconds.

EXAMPLE 2

A final sample was obtained in the same manner as example 1 except that the sample was kept at 140° C.

EXAMPLE 3

A final sample was obtained in the same manner as example 1 except that the ozone concentration in the treating chamber was 98000 ppm and the treating time was 10 seconds.

CONTROL 1

A final sample was obtained in the same manner as example 1 except that the sample was not subjected to the ozone treatment.

CONTROL 2

A final sample was obtained in the same manner as example 1 except that the sample was kept at 50° C.

CONTROL 3

A final sample was obtained in the same manner as example 1 except that the ozone concentration in the treating chamber was 5000 ppm and the treating time was 10 seconds.

CONTROL 4

A final sample was obtained in the same manner as example 1 except that the ozone concentration in the treating chamber was 98000 ppm, the sample was kept at 140° C. and the treating time was 3 minutes.

CONTROL 5

A final sample was obtained in the same manner as example 1 except that oxygen gas was introduced through the gas introduction ports 10 and 11 at 250 ml/min and 500 ml/min, respectively.

The crystal ratio, oxygen content and Y-output of the final samples were measured and the resistance to oxygen attack was evaluated.

Measurement of Area Ratio of CoOOH 130 Plane

The area strengths of CoOOH 130 plane ($2\theta=35.0°$) and CoO 111 plane ($2\theta=36.5°$) were measured by use of X-ray diffraction system (manufactured by RIGAKU K.K.) provided with an attachment for thin-film with the incidence angle of X-rays to the thin-film set at 1°, and the ratio of the area strengths was calculated according to formula a/b wherein a represents the area strength of the CoOOH 130 plane and b represents the area strength of the CoO 111 plane.

The measuring conditions were as follows.
X-ray source: Cu Anode, 50 kV, 180 mA
scanning speed: ¼ deg/min
Time Constant: 10 sec

Measurement of Oxygen Content

Was measured by Auger electron spectrometry.

Method of Evaluating Resistance to Corrosion

A 5 wt % solution of salt in water was sprayed on each final sample for 3 minutes and then each final sample was left to stand for 2 days in an atmosphere of 90% RH at 60° C. Thereafter the surface state of the ferromagnetic metal thin-film of each final sample was inspected by naked eyes and through an optical microscope ($\times$50), and was evaluated as follows according to production of rust.

| | |
|---|---|
| 1 point | rust can be found by the naked eyes substantially over the entire area |
| 2 point | rust can be found by the naked eyes |
| 3 point | rust cannot be found by the naked eyes but substantial amount of rust can be found through the optical microscope |
| 4 point | rust cannot be found by the naked eyes but a small amount of rust can be found through the optical microscope |
| 5 point | rust can be found neither by the naked eyes or through the optical microscope |

Measurement of Y-output

An 8 mm wide strip was cut out from each final sample and was provided with a leader tape on each end. The magnetic recording tape thus obtained was loaded in a modified 8 mm VTR FUJIX-8 (FUJI PHOTO FILM CO., LTD), the Y-output was measured at a recording frequency of 7 MHz by a spectrum analyzer. In this measurement, the Y-output of control 1 was assumed to be 0 dB.

The result of the measurement was as shown in the following table.

| | CoOOH/CoO | resistance to corrosion | Y-output (dB) | oxygen content (at %) |
|---|---|---|---|---|
| ex. 1 | 0.071 | 5 | −0.2 | 22.1 |
| ex. 2 | 0.032 | 5 | −0.5 | 23.4 |
| ex. 3 | 0.027 | 5 | −0.5 | 24.0 |
| con. 1 | 0.213 | 1 | 0 | 18.7 |
| con. 2 | 0.145 | 2 | 0.1 | 19.3 |
| con. 3 | 0.189 | 1 | −0.2 | 19.0 |
| con. 4 | 0.001 | 5 | −2.9 | 27.1 |
| con. 5 | 0.121 | 3 | 0.3 | 13.6 |

What is claimed is:

1. A metal thin-film magnetic recording medium comprising a non-magnetic base and a ferromagnetic metal thin-film formed on the non-magnetic base said thin film containing Co as a major component and having an oxygen content in the range of 15 at % to 27.1 at %,
wherein the ratio of the area of the 130 plane of CoOOH of said metal thin-film to that of the 111 plane of CoO of said metal thin-film, obtained by a thin-film X-ray diffraction method, is in a range greater than or equal to 0.003 and less than 0.1.

2. A metal thin-film magnetic recording medium as defined in claim 1 in which said metal thin-film is 500 to 5000 Å in thickness.

3. A metal thin-film magnetic recording medium as defined in claim 1 in which said ferromagnetic metal thin-film is obtained by depositing ferromagnetic metal on said non-magnetic base, oxdizing gas being applied to a vapor flow of the ferromagnetic metal during deposition at an angle of incidence from both a side where the angle of incidence of the vapor flow to the non-magnetic base is small and a side where the angle of incidence is large.

4. A metal thin-film magnetic recording medium as defined in claim 1 in which said ferromagnetic metal thin-film is obtained by forming a ferromagnetic thin-film on a non-magnetic base and exposing it to an atmosphere containing ozone.

5. A metal thin-film magnetic recording medium as defined in claim 1 in which said ferromagnetic metal thin-film is obtained by depositing ferromagnetic metal on said nonmagnetic base so that the minimum angle of incidence of the vapor flow to the nonmagnetic base is 20° to 60°.

6. A metal thin-film magnetic recording medium as defined in claim 1 in which lubricant is contained in an exposed surface of said ferromagnetic metal thin-film.

7. A metal thin-film magnetic recording medium as defined in claim 4 in which said ferromagnetic metal thin-film is kept at 80° to 140° C. during exposure to the atmosphere containing ozone.

* * * * *